US006832362B2

United States Patent
Nuber

(10) Patent No.: US 6,832,362 B2
(45) Date of Patent: Dec. 14, 2004

(54) PROCESS AND SYSTEM FOR REPEATER INSERTION IN AN IC DESIGN

(75) Inventor: Paul Douglas Nuber, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 209 days.

(21) Appl. No.: 10/164,222

(22) Filed: Jun. 5, 2002

(65) Prior Publication Data

US 2003/0229878 A1 Dec. 11, 2003

(51) Int. Cl.⁷ .............................................. G06F 17/50
(52) U.S. Cl. ............................. 716/12; 716/10; 716/9
(58) Field of Search ........................... 716/1–2, 4, 7–14

(56) References Cited

U.S. PATENT DOCUMENTS

| | | | | |
|---|---|---|---|---|
| 5,995,735 A | * | 11/1999 | Le ................................. 716/13 |
| 6,110,221 A | * | 8/2000 | Pai et al. ........................ 716/8 |
| 6,408,426 B1 | * | 6/2002 | Josephson et al. ............ 716/12 |
| 6,467,074 B1 | * | 10/2002 | Katsioulas et al. ............ 716/17 |
| 6,473,889 B1 | * | 10/2002 | Gluss et al. .................... 716/8 |
| 6,539,529 B2 | * | 3/2003 | Ebisawa et al. ............... 716/10 |
| 6,550,048 B1 | * | 4/2003 | Muddu ......................... 716/10 |
| 6,588,001 B1 | * | 7/2003 | Porterfield ...................... 716/8 |
| 6,662,349 B2 | * | 12/2003 | Morgan et al. ............... 716/10 |

OTHER PUBLICATIONS

Victor Adler and Eby G. Friedman, " Repeater Insertion to Reduce Delay and Power in RC Tree Structures" from the 31st A SILOMAR Conference on Signal, Systems and Computers, 1998,pp 749–752.

Culetu, Amir, MacDonald, " A Practical Repeater Insertion Method in High Speed VLSI Circuits" from the Design Automatio Conference, 1998, pp392–395.

* cited by examiner

Primary Examiner—Leigh M. Garbowski
(74) Attorney, Agent, or Firm—June L. Bouscaren

(57) ABSTRACT

A method of generating an IC design comprises the steps of generating an intermediate routing result to define interconnects between functional blocks on an IC. The next step is defining one or more repeater ranches in an interstice of the IC and generating a repeater placement plan for placement of repeater elements according to the repeater ranch boundary constraints. The process continues with the step of generating a final routing result to define interconnects between functional blocks that interconnect the repeater elements according to the repeater placement plan.

26 Claims, 10 Drawing Sheets

PROCESS AND SYSTEM FOR REPEATER INSERTION IN AN IC DESIGN

BACKGROUND

Signal propagation delay is a significant factor in high performance VLSI design. Signal propagation delay not only slows performance of an Integrated Circuit ("IC"), but if the signal propagation delay exceeds the period of an IC clock, the IC will simply not function properly. Similarly, signal transition time is another significant factor in high performance VLSI design. A transition time that is too long permits noise to couple into the signal, which can cause spurious transitions of the signal in downstream circuitry, which may also cause functional errors or failures.

Signal propagation delay is primarily due to resistive-capacitive ("RC") delay of the metal interconnects between circuit elements of the IC design. In general, signal propagation delay increases geometrically as a function of interconnect length. The resistive and capacitive components of the interconnect also affect transition time of the signal being propagated. It is desirable to keep the transition time below a specified maximum on all of the interconnects. IC designers address the issue of signal propagation delay and signal transition time using strategic placement of repeaters. Too many repeaters, however, consume space on the IC without improving the IC performance. It is important, therefore, to position repeaters only where they are beneficial to the overall design.

Certain constraints in IC design present a challenge to the repeater insertion process. Because optimum repeater insertion for RC delay is a function of interconnect length, repeater placement options are limited. The space on the IC design for optimal repeater insertions for any one interconnect may already be populated by another optimally placed repeater or the IC circuit design itself. In this case, the repeater may be placed in a different and sub-optimal position or the circuit element or repeater already populating the optimum space may be moved elsewhere. As one of ordinary skill in the art appreciates, this proposed shifting of repeaters or circuit elements has an impact on the performance of the overall IC design. Accordingly, repeater placement involves a number of trade-offs in view of the competing objectives. The competing objectives are minimizing interconnect RC delay and obtaining a target transition time while limiting the impact of the additional repeaters on IC space and power.

A known repeater insertion method comprises executing interconnect routing software for a plurality of interconnecting functional blocks. In the known method, an automatic repeater insertion process executes and attempts to position repeater elements at optimum spaces along the interconnects. Unfortunately, the optimum placement of the repeater elements is often directly over one of the functional blocks. The IC designer then assesses the result and manually identifies offending repeaters and repositions them for each interconnect or removes them entirely. As one of ordinary skill in the art appreciates, such a manual assessment, identification and repeater placement or removal process is time consuming and, therefore, expensive, and may not always result in an optimum IC design. Once the repeaters are moved, it is also known to group the repeaters. Disadvantageously, this grouping step can cause the repeaters to be positioned too close or too far from each other.

There is a need, therefore, for an improved process of repeater placement in an IC design and a system for implementing the improved process.

SUMMARY

In an embodiment according to the teachings of the present invention a method of generating an IC design comprises the steps of generating an intermediate routing result to define interconnects between functional blocks on an IC. The next step is defining one or more repeater ranch boundaries in an interstice of said IC and generating a repeater placement plan for placement of repeater elements according to the repeater ranch boundary constraints. The process continues with the step of generating a final routing result to define interconnects between functional blocks that interconnect the repeater elements according to said repeater placement plan.

In another embodiment according to the teachings of the present invention a system for designing an IC comprises a processing element and means cooperating with the processing element for generating an intermediate routing result. The intermediate routing result defines interconnects between functional blocks on the IC. The system further comprises means for defining one or more repeater ranch boundaries in an interstice of said IC and means cooperating with the processing element for generating a repeater placement plan for placement of repeater elements according to the repeater ranch boundary constraints. The system embodiment further comprises means cooperating with the processing element for generating a final routing result to define interconnects between functional blocks that interconnect the repeater elements according to the repeater placement plan.

DETAILED DESCRIPTION

Figure 1:
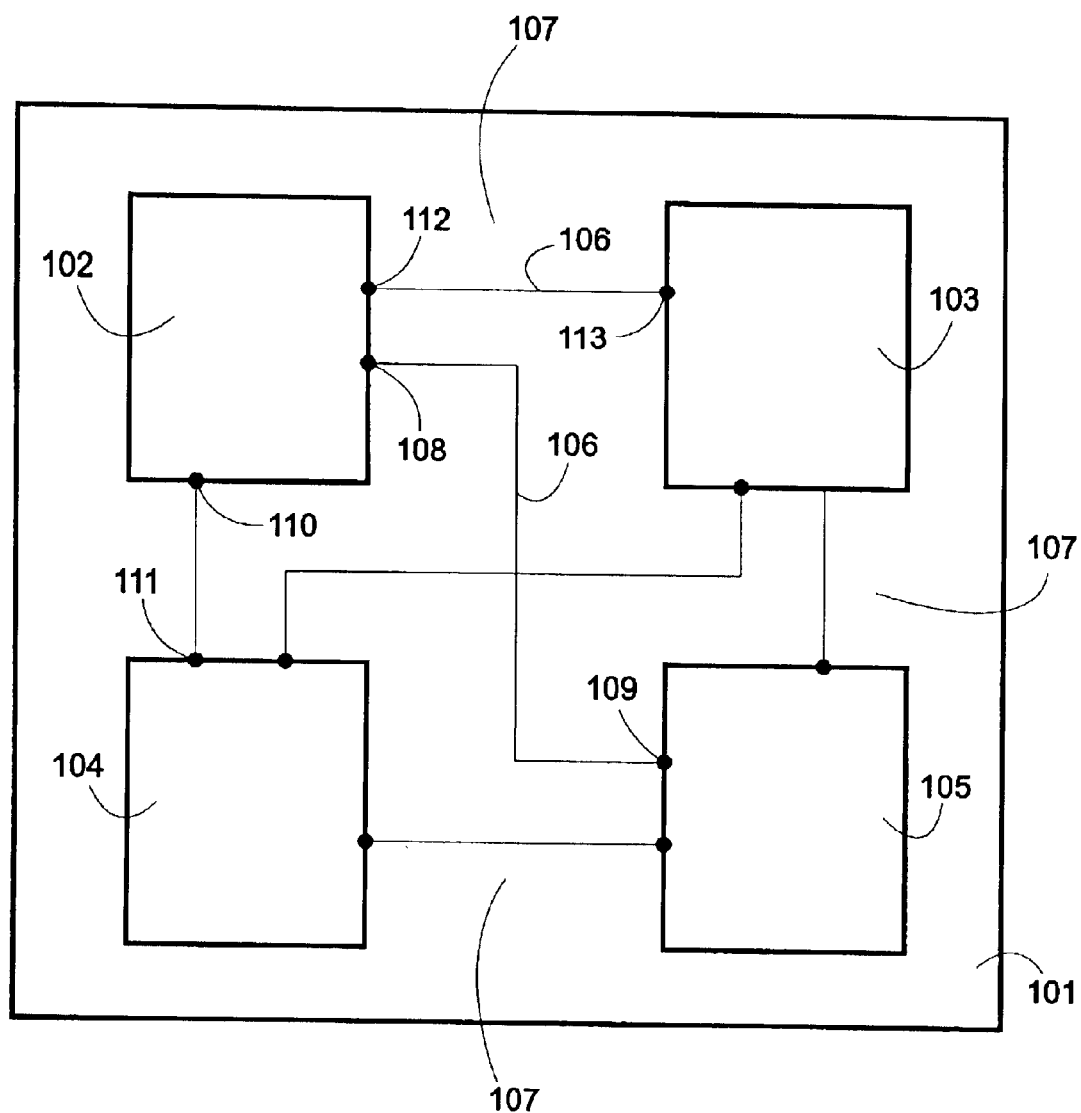
FIG. 1 illustrates a hierarchical approach to IC design.
Figure 2:
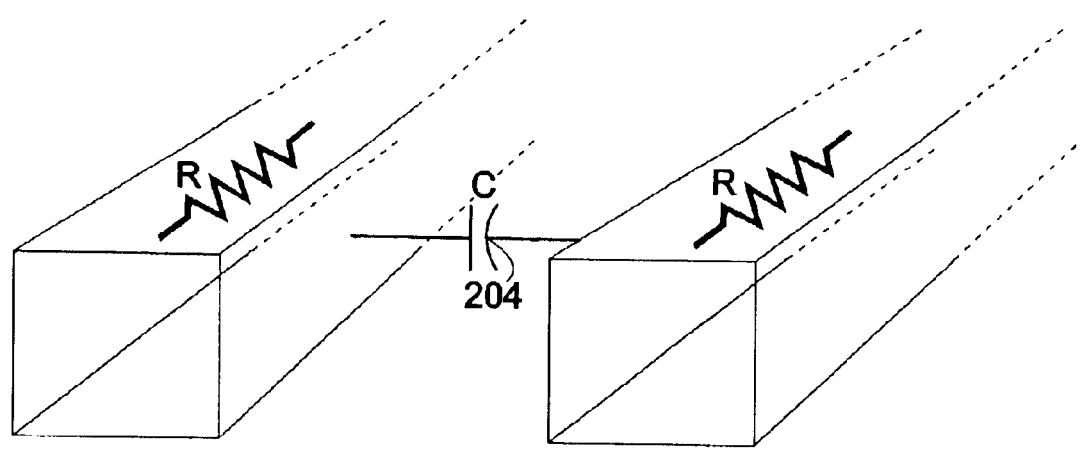
FIG. 2 is a cross section of parallel interconnects illustrating inherent resistive and capacitive impedances

With specific reference to FIG. 1 of the drawings, there is shown an illustration of an IC with a hierarchical block design in which an IC die 101, comprises a plurality of functional blocks 102 through 105. An interstice 107 comprises the area of the IC 101 that does not contain one of the functional blocks 102–105. In the hierarchical block design methodology, the interstice 107 is available for positioning interconnects and repeaters on the interconnects. Each functional block 102, 103, 104, 105 is a largely self-contained constituent part of the system on the IC 101. The functional blocks 102–105 are shown as equally sized and equally spaced apart over the surface area of the IC 101. As one of ordinary skill in the art appreciates, neither the size of the functional blocks nor the space between the functional blocks must be the same, but is shown that way for purposes of clarity. Each functional block 102–105 is connected to one or more of the other functional blocks 102, 103, 104, 105 through one or more interconnects 106 that connect two or more functional block ports 108, 109, 110, 111, 112, and 113. The one or more interconnects 106 cross over the interstice 107 to interconnect the functional blocks 102–105. In the illustration of FIG. 1, the functional block 102 has a port definition including functional block ports 108, 110, and 112. The hierarchical block design of the IC 101, as the name implies, permits each functional block 102–105 to comprise a plurality of smaller functional blocks (not shown) and respective interstice (also not shown for the child functional blocks). Accordingly, Each functional block 102 through 105 may be a parent functional block comprising a plurality of child functional blocks and an interstice and each child functional block has its own port definition. The hierarchical nature of the IC design may be recursive and is limited only by practical aspects of the IC. Accordingly, a child functional block may also be a parent functional block and further comprise multiple child blocks and interstice at the next lower level of IC design. All of the teachings herein are as applicable to the interconnection of multiple parent functional blocks as they are applicable to the interconnection of multiple child functional blocks. It is to be understood by one of skill in the art that there are typically many more than four functional blocks. Four is the number used for illustrative purposes. The interconnects 106 are typically metal and have a rectilinear cross-section as shown in FIG. 2 of the drawings. The inherent resistance 202 of the interconnect 106 increases linearly as a function of interconnect length. Because the interconnects 106 have a rectilinear cross section, two or more interconnects 106 running parallel to each other exhibit an inherent parallel plate capacitance 204. The inherent capacitance 204 also increases linearly with length of the parallel disposition of two adjacent interconnects 106. Signal propagation delay through an interconnect 106 is a function of the resistive-capacitive ("RC") product of the two inherent impedances 202, 204. Accordingly, signal propagation delay increases geometrically with interconnect length. The addition of a repeater in the center of an interconnect increases the speed of signal propagation by two times. In the example of the 16 mm by 17 mm IC 102, a typical interconnect 106 has a 0.28 by 0.28 micron cross-section. This type of interconnect has approximately a 8 kohm inherent resistance and approximately 3 pF capacitance over a 15 mm length. For an IC with a 250 MHz clock, there is a 4 nsec clock cycle. In this example, the optimum interconnect length is approximately 2000 microns and an interconnect length longer than 2000 microns benefits from one or more repeaters evenly spaced along the interconnect length.

One aspect of hierarchical block IC designs is that proper administration of the functional blocks requires that the area within the confines of the functional block 102–105 be populated with only those electrical elements that comprise the functional block itself. In many hierarchical block designs there is at least one metalization layer that is dedicated to accepting "fly-over" interconnect metal. "Fly-over" metalization layers are known in the art and comprise a layer of metal that is insulated from other metal layers that make up the IC. Accordingly, an interconnect wire on the fly-over interconnect metal passes over the top of a functional block without connecting to it. The "fly-over" interconnect does not adversely affect the circuitry of the functional block and, therefore, the hierarchy of the IC design. If a repeater element must be inserted in the portion of the interconnect that "flies over" the functional block, however, the insertion of the repeater element into the functional block requires that the repeater element be placed on the silicon as opposed to the "fly-over" layer. Placing a repeater element on the silicon dictates a change to the port definition of the block. Specifically, two ports must be added to the functional block in order to implement the addition of the repeater. This modification to the functional block renders the post-repeater functional block pin incompatible with the pre-repeater functional block and, for purposes of managing the hierarchical block design, is undesirable. As an example, a first level of hierarchy may comprise a 16 mm by 17 mm IC 101 with a 10 mm by 10 mm central area covered by four functional blocks 102, 103, 104, 105. Such as IC design could have a 20 mm worst case interconnect length between functional blocks 104. Such an interconnect requires the insertion of a plurality of repeater elements. The optimum position of the repeater elements, however, may not be desirable from a perspective of the overall IC, specifically the positioning of the functional blocks 102–105.

Figure 3:
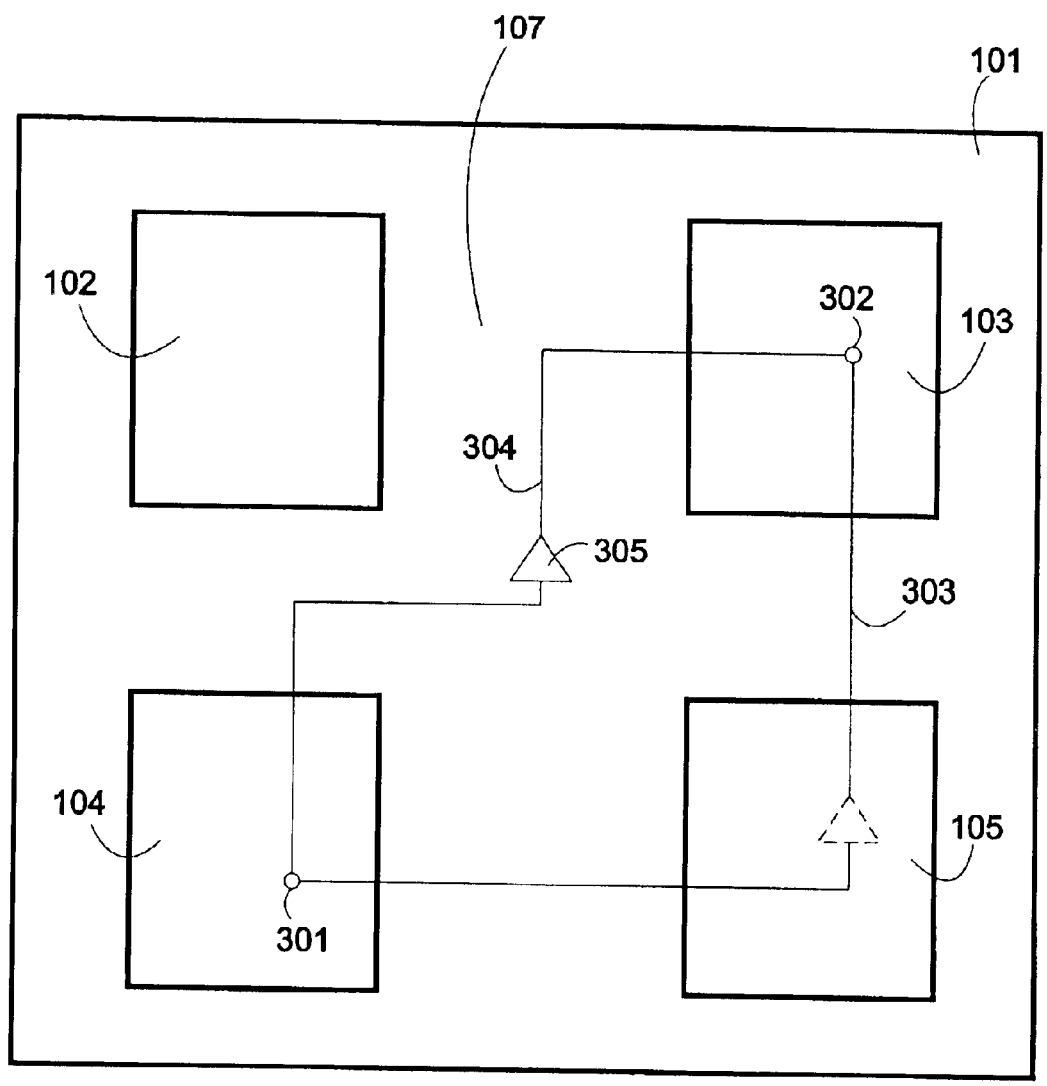
FIG. 3 illustrates first and second alternate paths interconnecting two points within two separate functional blocks.

With specific reference to FIG. 3 of the drawings, there is shown first and second alternate paths 303, 304 that known routing software may assign as an interconnect between first and second ports 301, 302 in two different functional blocks 103 and 104. The first alternate path 303 comprises a single horizontal run and a single vertical run. From the point of view of the routing software, the first alternate path is optimal because is includes a minimum interconnect length between the first and second ports 301, 302. As one of ordinary skill in the art appreciates, the routing software generates interconnects with either the vertical or horizontal runs and does not generate any diagonal runs. Accordingly, the first alternate path 303 is of minimum length even though it is not a straight line connecting the first and second ports 301, 302. The second alternate path 304 comprises two vertical runs and two horizontal runs. The second alternate path 304 also is a minimum interconnect length path between the two ports 301, 302. Typical routing software, therefore, views the first and second alternate paths 303 and 304 are equally desirable. With respect to repeater placement, however, the second alternate path 304 is optimal. The second alternate path 304 is preferred because the interconnect length of the second alternate path 304 is greater than the maximum desirable interconnect length of 2000 microns in the example. Therefore, one or more repeaters should be placed along the interconnect path 304. Assuming that in the illustrated case, the preferred repeater placement is in the middle of the interconnect 304, the first alternate path 303 would indicate repeater placement somewhere within the child functional block 105. In certain IC designs, placement of a repeater element within the child functional block 105 is not desirable. Accordingly, the second alternate path 304 is preferred. The second alternate path 304 has the same interconnect length as the first alternate path 303 except that the optimum repeater position is within an interstice 107. It is, therefore, possible to position a repeater element 305 at an optimum position along the interconnect 304 having an optimum length without affecting the circuitry of any one functional block 102–105.

Figure 4:
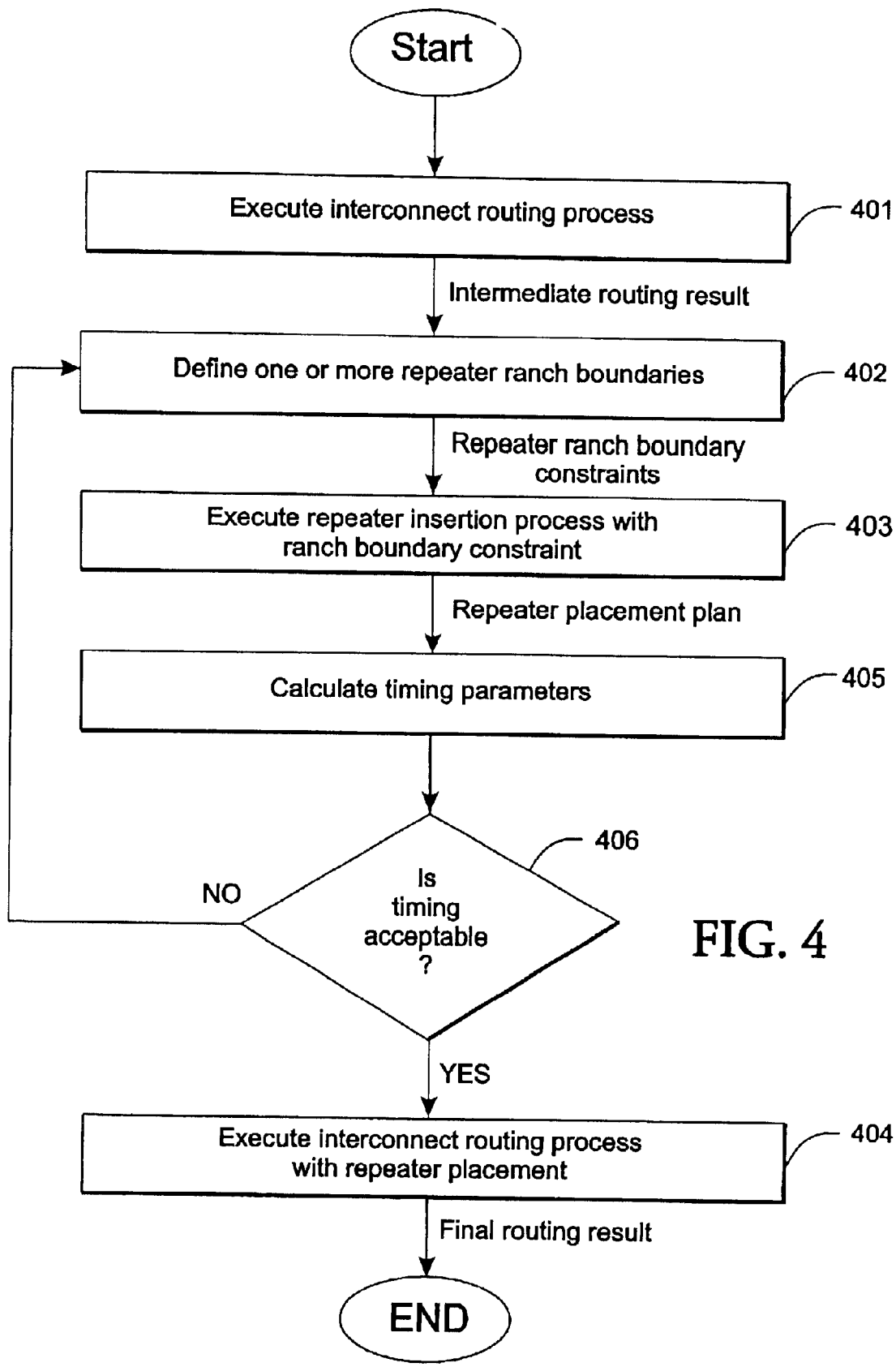
FIG. 4 illustrates a process flow an embodiment according to the teachings of the present invention.

It is desirable, therefore, for the routing software to have some additional intelligence with respect to appropriate repeater placement. With specific reference to FIG. 4 of the drawings, there is shown a flow chart of a process according to the teachings of the present invention that provides repeater placement information for the interconnect routing software. Fundamentally, the process executes an interconnect routing process 401 to generate an intermediate routing result. The IC designer then assesses the intermediate routing result and for it, defines 402 one or more repeater ranch boundaries, which are areas that may contain repeater elements. Then a repeater insertion process is executed 403 with benefit of the repeater ranch boundary constraints. The repeater insertion process 403 generates a repeater placement plan that optimizes placement of repeaters along the interconnect while still placing repeater elements only within the repeater ranch boundaries. The system calculates the timing parameters for the interconnects according to the repeater placement plan 405. If all timing is within acceptable limits 406, the intermediate routing result is then discarded, and the routing process executes 404 with benefit of the repeater placement plan. If all timing is not within acceptable limits 406, then additional or different repeater ranch boundaries are defined at 402 and the repeater insertion process is executed again with the different repeater ranch boundaries.

The process begins with execution of the interconnect routing software. An example of routing software is the Warp software package available from Cadence Design Systems, Inc. The Warp software runs on a Unix based Workstation from Hewlett-Packard Co. having a processing element, memory capacity, and graphical display suitable for Computer Aided Design ("CAD") processing needs. The present teachings, however, will increase computer memory requirements. Alternatively, most commercial or proprietary interconnect routing software may be used. The interconnect routing software assigns optimal length interconnects with some congestion management for all interconnects 106 of the IC 101. In a preferred embodiment, the optimal length interconnect is a minimal length interconnect. For purposes of the overall IC 101, the interconnect routing software attempts to find the shortest interconnect length for the aggregate of all interconnects on the entire IC surface. Execution of the interconnect routing software generates an intermediate routing result that defines the position and length of all interconnects 106 of the IC 101. The intermediate routing result includes interconnects that traverse the IC interstice 107, but may also include fly-over interconnects that traverse one or more functional blocks 102–105 on the metalization layer disposed over the circuitry layer of the functional block itself.

Figure 5:
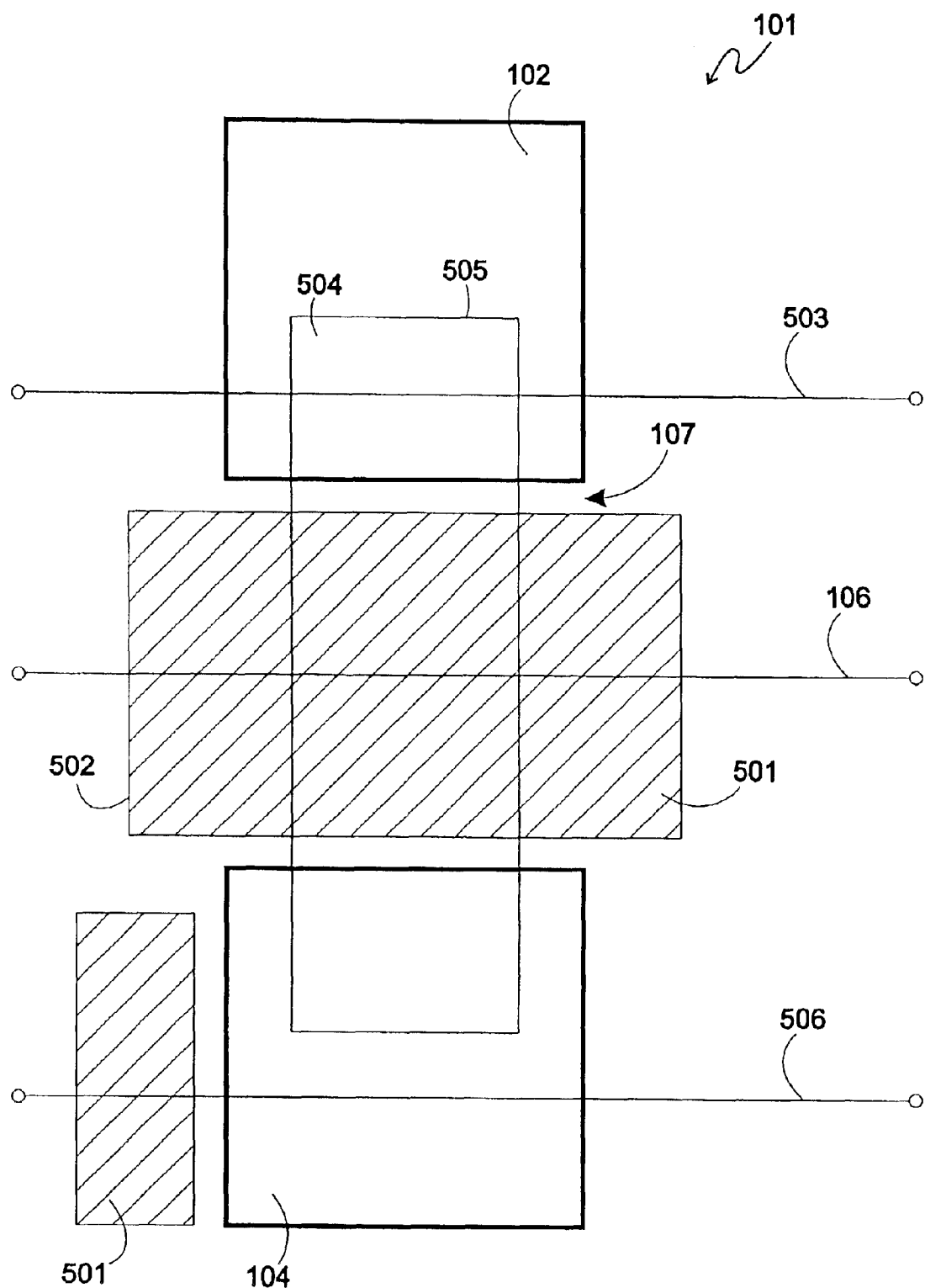
FIG. 5 illustrates boundaries for purposes of visualizing an embodiment of a process according to the teachings of the present invention.

With specific reference to FIG. 5 of the drawings, there is shown an illustrative example of the intermediate routing result. The IC designer assesses the intermediate routing result and, in preparation for execution of a repeater insertion process, establishes one or more repeater ranches 501 in the interstice 107 of the IC 101. The repeater ranches 501 are a constraint to the repeater insertion process and comprise areas on the IC 101 within which all repeater elements ere to be exclusively positioned. Each repeater ranch 501 two are shown in FIG. 5) is defined by delineating an enclosed area with a repeater ranch boundary 502. The IC designer may choose to position a repeater ranch 501 in an area of increased density of interconnects. This provides the repeater insertion process with an incentive to find the optimum repeater placement for a large number of interconnects within the repeater ranch 501. With specific reference to FIG. 6 of the drawings, there is shown an illustrative example of a repeater placement plan. If the unconstrained optimum repeater placement for the interconnect 106 is outside of the repeater ranch 501, then the repeater ranch boundary constraint causes the repeater insertion process to place a repeater element 601 at an edge, but still within, the repeater ranch boundary 502.

With specific reference to FIG. 5 of the drawings, it is common that certain interconnects are designated as fly-over interconnects as shown by reference numerals 503. If the fly-over interconnect 503 benefits from the insertion of a repeater element, it is not desirable that the repeater element be positioned within the functional block 102. Instead, and with specific reference to FIG. 6 of the drawings, it is desirable for the interconnect 503 to be lengthened slightly with two additional vertical runs 603 to detour the fly-over interconnect 503 through the repeater ranch 501. This re-routing of the fly-over interconnect 503 permits insertion of repeater element 602 within the repeater ranch 501. A capture zone 504 is a parameter used in the re-routing portion of the repeater insertion process. The capture zone 504 is established by defining an enclosed capture zone boundary 505 that covers all or a portion of a functional block 102, 104. The repeater insertion process utilizes the definition of the capture zone 504 to determine which interconnects may be re-routed, thereby adding overall length, in order to more optimally place a repeater element in the modular IC design. If the fly-over interconnect 503 intersects the capture zone 504 and the interconnect 503 requires the repeater element 602, the interconnect is re-routed into the repeater ranch 501 and the repeater 602 is appropriately positioned along the interconnect 503 to optimize overall interconnect delay.

Figure 6:
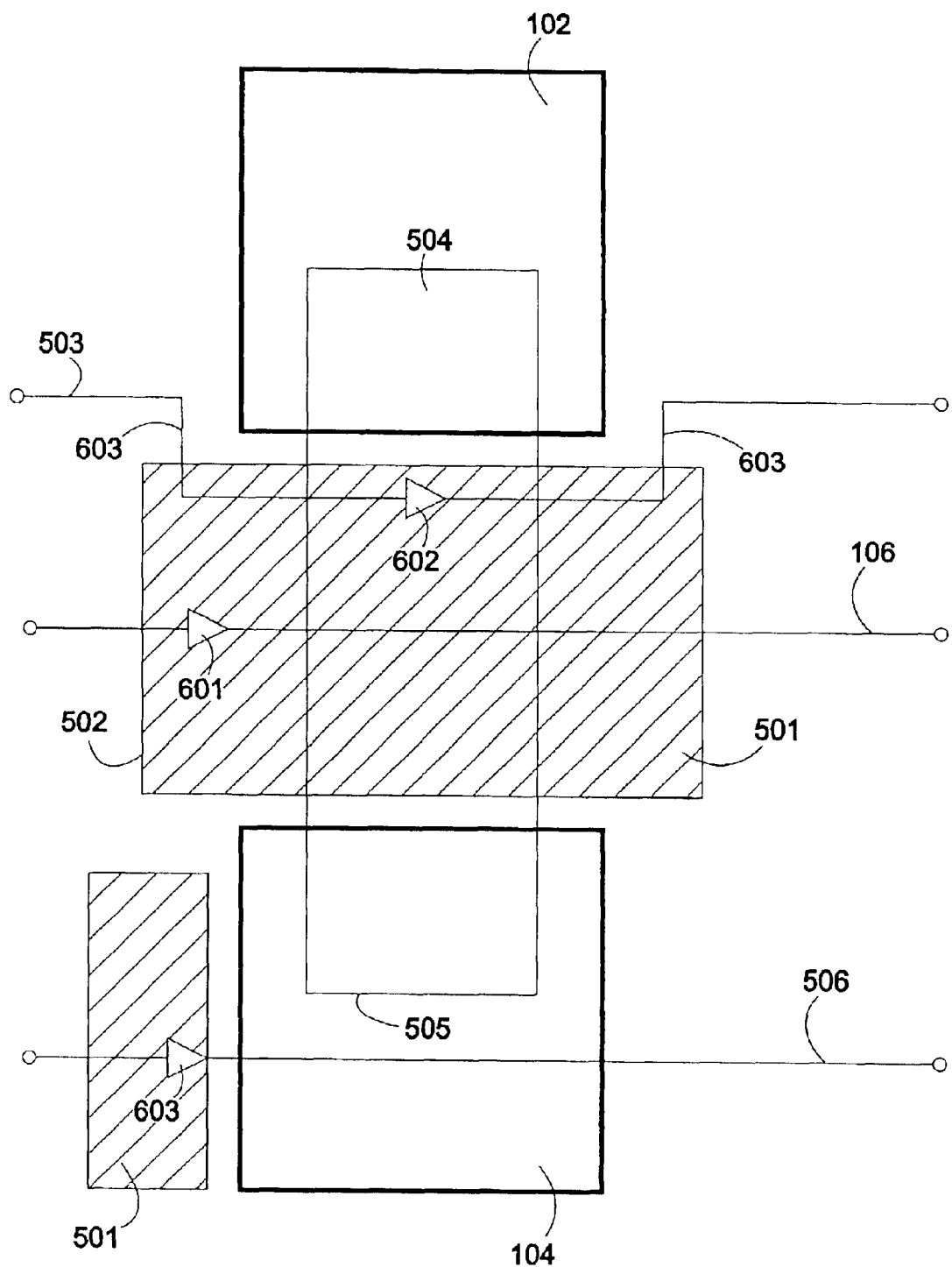
FIG. 6 illustrates interconnect re-routing and repeater element placement according to the teachings of the present invention.

With specific reference to FIG. 6 and to fly-over interconnect shown as reference numeral 506, if the fly-over interconnect 506 does not intersect the capture zone 504, the repeater insertion process does not attempt to re-route the interconnect 506 through a repeater ranch 501. Alternatively, the repeater insertion process finds the optimum repeater position that is within one of the repeater ranches 501. If the fly-over interconnect 106 does not require a repeater, it is unaffected.

After defining the repeater ranches 501 and the capture zones 504, the method continues with execution of a repeater insertion process. The repeater insertion process executes with benefit of the previously defined repeater ranch boundary 502 and capture zone boundary 505 constraints. The repeater insertion process optimizes interconnect delay for each interconnect by inserting as many repeaters along each interconnect 106, 503 as are appropriate to minimize interconnect delay. The result of the repeater insertion process is a repeater placement plan where repeater elements are positioned along those interconnects. The intermediate routing result is then discarded and the interconnect routing process is executed again to generate a final routing result.

Figure 7:
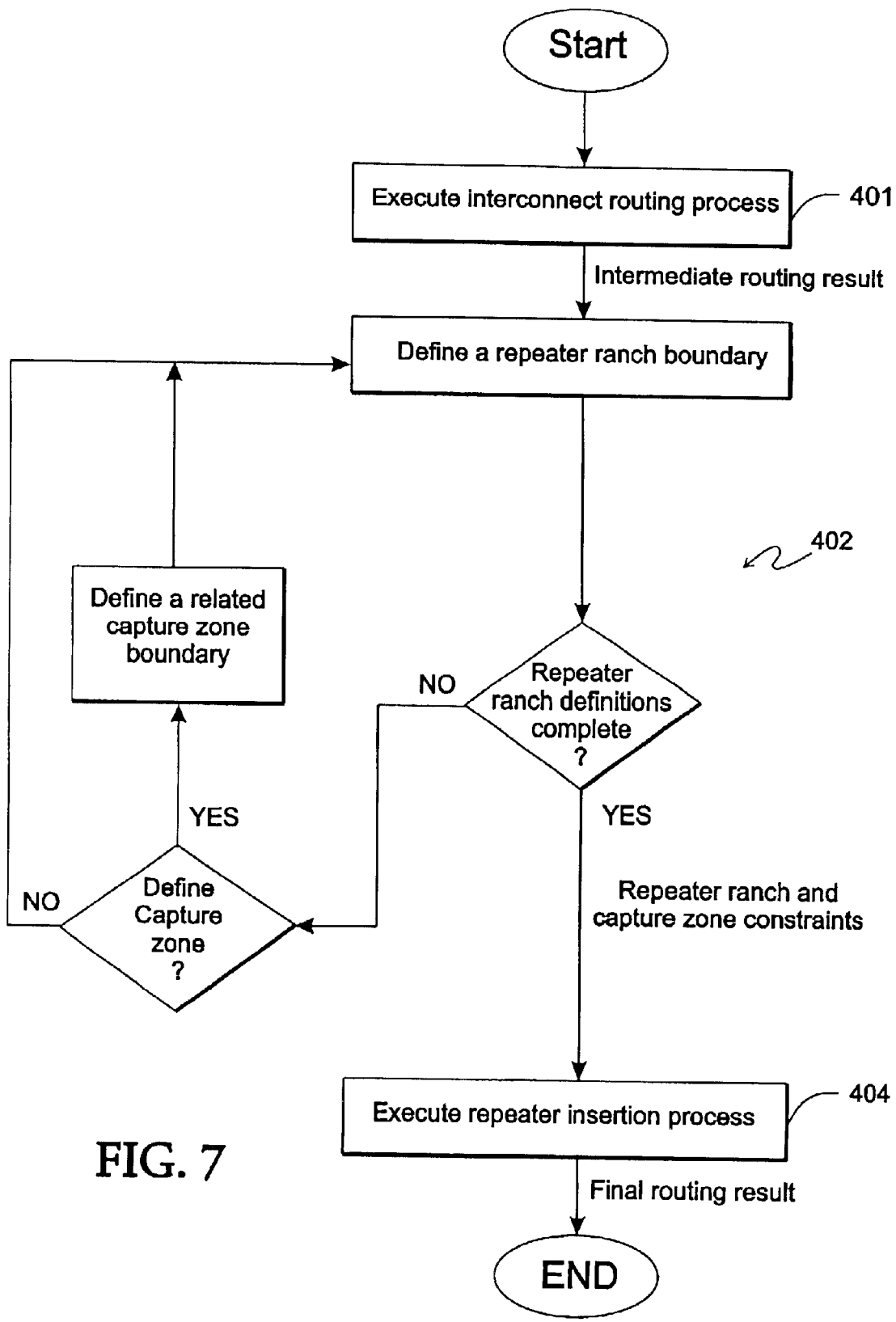
FIG. 7 illustrates a process flow for an embodiment of a repeater ranch and capture zone definition process according to the teachings of the present invention.
Figure 8:
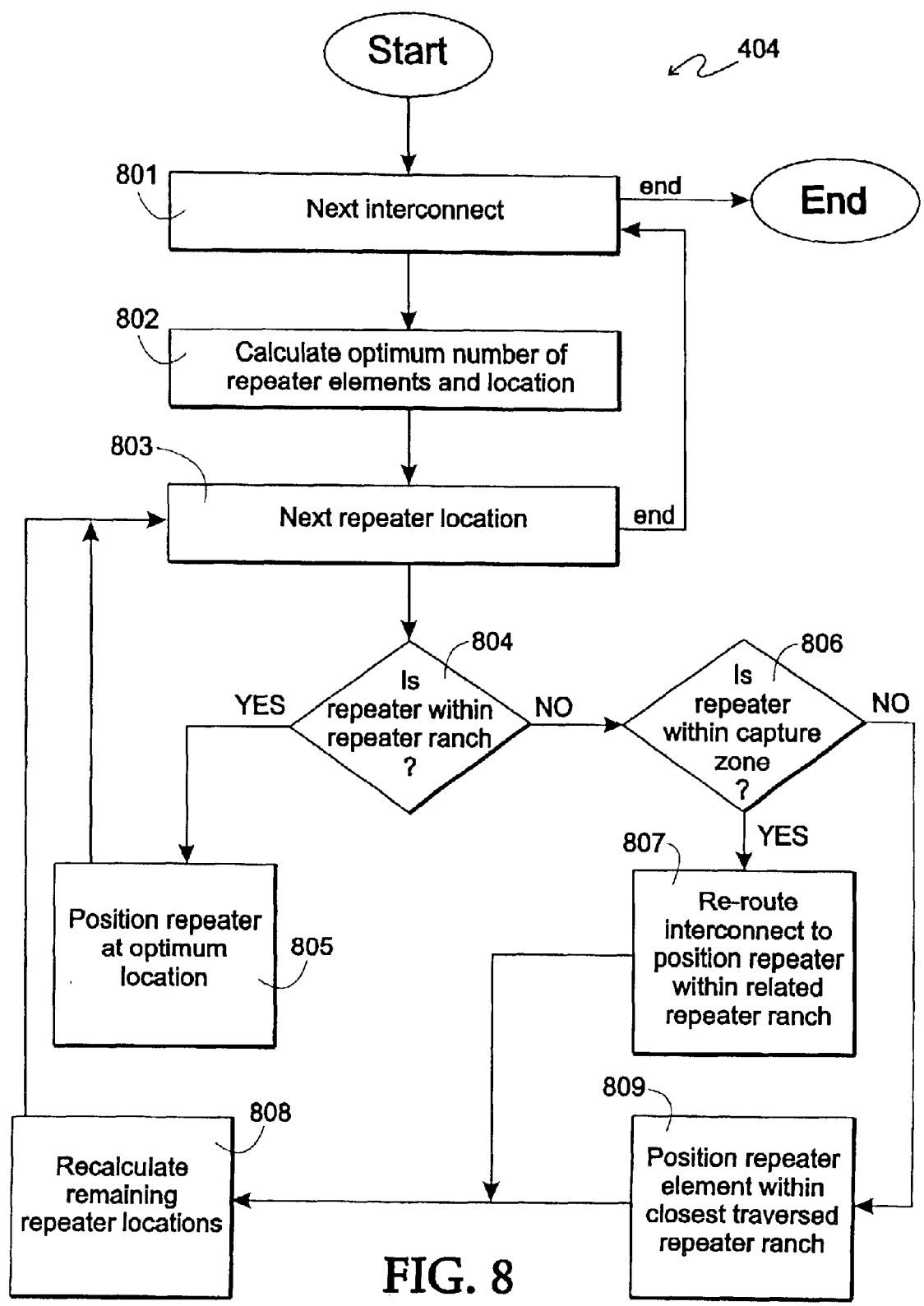
FIG. 8 illustrates a process flow for an embodiment of a repeater insertion process according to the teachings of the present invention.

With specific reference to FIGS. 7 & 8 of the drawings, there is shown illustrative flow charts of a repeater insertion process according to the teachings of the present invention. FIG. 7 of the drawings illustrates the process in which an IC designer is able to choose where the repeater ranches should be positioned on the IC 101. In a modular design, all repeater ranches are located in the interstice 107 of the IC. Additionally, the step of defining one or more repeater ranches 402 shown in FIG. 7 illustrates that an IC designer may choose to impose the repeater ranch constraint with or without a related capture zone. When all of the desired repeater ranch and capture zones are defined, the process proceeds to repeater insertion.

With specific reference to FIG. 8, there is shown an illustrative flow chart of the repeater insertion process 404 in which repeater insertion begins with identification of a single interconnect. The process comprises a loop 801 that performs the repeater insertion process for each interconnect in the intermediate routing result. If all interconnect characteristics are similar, such as cross sectional dimensions, operating frequency, and type of metal, there is a maximum interconnect length that holds true for all interconnects. Accordingly, the repeater insertion process may have a priori information concerning the maximum interconnect length. Alternatively, the repeater insertion process may calculate the maximum length for each interconnect based upon interconnect characteristics. For each interconnect, the process calculates 802 an optimum number of repeater elements for the interconnect as well as the optimum locations for each repeater element. In a process loop 803 for each repeater element, the process assesses 804 whether the repeater location is within the boundaries of one of the repeater ranches 501. If so, the repeater is positioned at its optimum location 805 and the process continues by assessing the next repeater element 803. If the optimum repeater location is not within one of the repeater ranches, the process determines 806 if the repeater falls within one of the capture zones 504. If so, the interconnect is re-routed 807 so that it traverses the repeater ranch 501 that is related to the capture zone 504 in which the optimum repeater location falls. The repeater may then be positioned 807 within the repeater ranch. Because the interconnect has been lengthened, the process re-calculates 808 the optimum position of the next repeater and all remaining repeaters to be inserted along the interconnect and continues 803 by processing the next repeater relative to the last one positioned. If the optimum repeater location is not in any one of the repeater ranches 501 nor any one of the capture zones 504 the process positions 809 the repeater element within the closest repeater ranch 501 to the optimum repeater position that is traversed by the interconnect. Because the repeater element position is not necessarily optimum in this case, it is beneficial to re-calculate 808 the remaining repeater element locations based upon the location of the current repeater element. When all interconnects are processed, the repeater insertion process ends, thereby generating a repeater placement plan. When the repeater elements are appropriately placed, the intermediate routing plan is discarded and the interconnect routing process 404 executes again. The second execution of the interconnect routing process is performed with benefit of the repeater placement plan. The interconnect routing process, therefore, is able to connect the repeater elements while performing the standard interconnect length optimization and congestion management functions and results in a final routing result.

Figure 9:
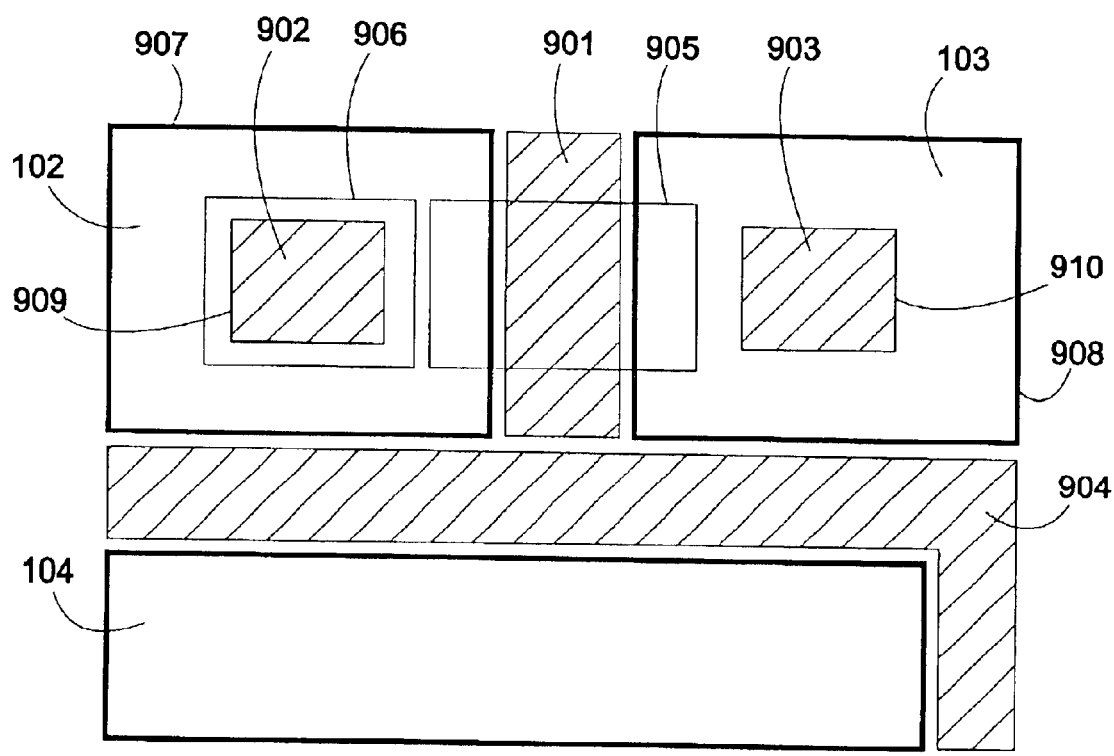
FIG. 9 illustrates an alternative IC layout showing possible repeater ranch and capture zone boundaries suitable for a process according to the teachings of the present invention.

Using the present teachings, additional possibilities present themselves with respect to management of interconnect paths and repeater insertion. With specific reference to FIG. 9 of the drawings, there is shown an alternative shape of the functional blocks 102, 103, and 104 that are a constituent part of the IC 101. The functional blocks 102 and 103 have an outer boundary 907, 908 respectively and an inner boundary 909, 910, respectively. The functional block 102, 103 of FIG. 9 is defined as the area of the IC on an interior of the outer boundary 907, 908 and on an exterior of the inner boundary 909, 910. Repeater ranches 902 and 903, respectively, are defined as the area of the IC on an interior of the inner boundary 909 and 910 respectively. In this type of design, the functional block port definition is limited to connections to those elements on an interior of the outer boundary 907, 908 and on an exterior of the inner boundary 909, 910. If a circuit element, such as a repeater, is positioned on an interior of the inner boundary 909, 910, it is not part of the functional blocks 102, 103 and does not affect the port definition of the functional block 102, 103. Therefore, the pre-repeater port definition of the functional blocks 102, 103 is pin compatible with the post-repeater port definition of the functional blocks 102, 103 of FIG. 9. Repeater elements may be positioned in the repeater ranches 902 and 903 and connected to fly-over interconnects without affecting the port designations of the functional blocks 102 or 103. Repeater ranches 901 and 904 are also defined in the interstice 107 between functional blocks 102, 103 and 104. In order to minimize the amount of interconnect length that must be added for the re-routing of fly-over interconnects, two capture zones 905 and 906 are disposed adjacent each other and direct the re-routing of the interconnect to whichever repeater ranch is closest.

Figure 10:
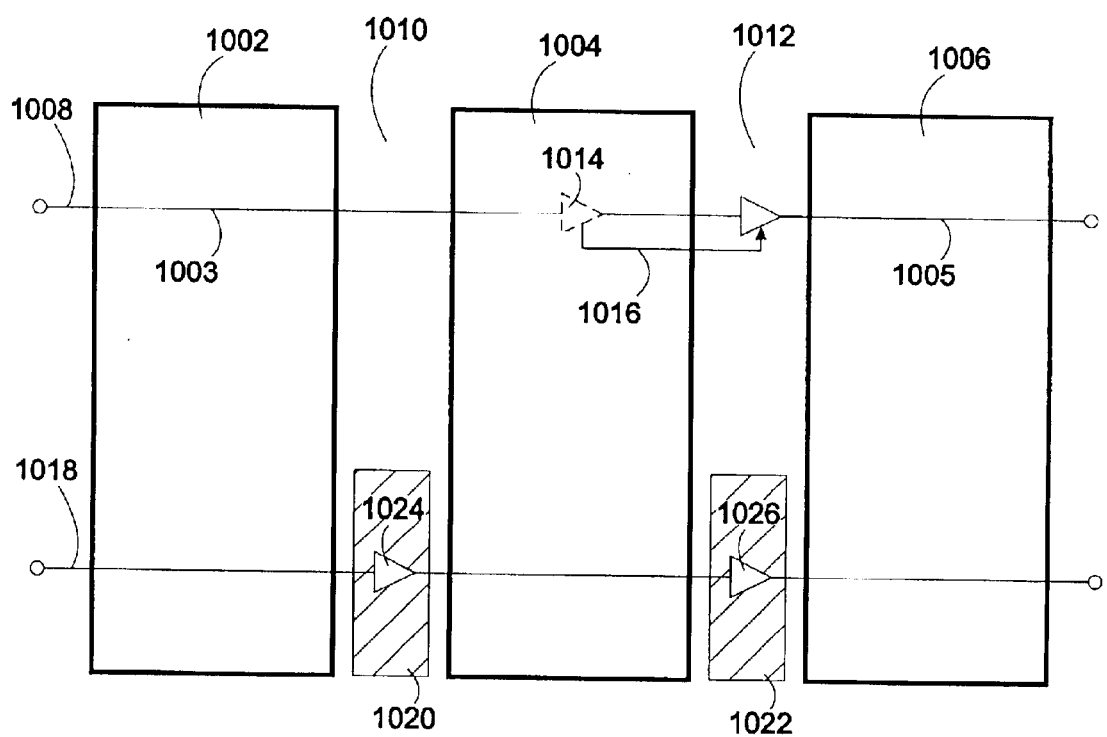
FIG. 10 illustrates an advantage of an embodiment of a method and system according to aspects of the teachings of the present invention.

With specific reference to FIG. 10 of the drawings, there is shown first, second and third functional blocks 1002, 1004, 1006 and fly-over interconnect 1008. To illustrate an advantage of a method and system according to the teachings of the present invention with a simple example, consider that fly-over interconnect 1008 requires at least one repeater element. Under the prior art, a repeater insertion process may position repeater element 1014 in the center of the second functional block 1004. An IC designer would then attempt to re-position the repeater either in interstice 1010 between the first and second functional blocks 1002, 1004 (not illustrated) or in interstice 1012 between the second and third functional blocks 1004, 1006 as shown by arrow 1016, whichever distance is shortest. In re-positioning the repeater element, a first segment 1003 of the interconnect is significantly longer than a second segment 1005 of the interconnect. This method uses additional IC designer time and may adversely affect the timing parameters of the interconnect 1008 to the point of being outside acceptable limits because the first segment 1003 is now too long. By contrast, a repeater insertion process embodiment according to aspects of the teachings of the present invention operates on interconnect 1018 with the benefit of first and second repeater ranches 1020, 1022 defined in interstices 1010, 1012, respectively. An embodiment of a method according to aspects of the present invention positions a first repeater 1024 in the first repeater ranch 1020. Upon placement of the first repeater 1024, the repeater insertion process then calculates the optimum length of the next segment and places a second repeater 1026 in the second repeater ranch 1022. The solution partitions the interconnect into three segments and is closer to the optimal solution because all calculations and decisions based thereupon as to interconnect segment length are made during the repeater insertion process. This obviates the need for re-positioning of sub-optimal original placements of repeater elements and, therefore, the risk of adversely affecting timing parameters based upon the changes made to the repeater placement plan. Stated another way, each repeater is placed optimally with respect to the last repeater placed obviating the need to re-position any repeater elements manually.

There are many other advantages of the present teachings which include, but are not limited to, maintenance of the integrity of a hierarchical block IC design while approaching the optimum placement of repeater elements as well as optimum length interconnect routing in a process that lends itself well to automation.

The teachings of the present invention are presented herein by way of illustrative examples and alternative embodiments. It is not intended that these examples and embodiments limit the scope of the invention claimed, rather they are used to clarify the present teachings. Alternate embodiments of the present invention are apparent to one of ordinary skill in the art with benefit of the present teachings. For example, the functional blocks 102–105, repeater ranches 501, and capture zones 504 need not be rectilinear polygons, but may be irregular in shape. The teachings of the present invention further lend themselves to a software implementation of the interconnect routing process and the repeater insertion process. The teachings herein may be applied to multiple level of design in a hierarchically designed IC.

What is claimed is:

1. A method of generating an IC design comprising the steps of:
   - generating an intermediate routing result to define interconnects between functional blocks on an IC,
   - defining one or more repeater ranches in an interstice of said IC, each said repeater ranch defined by repeater ranch boundaries,
   - defining one or more capture zones comprising an area within which one of said repeater elements that is positioned within said capture zone is repositioned within a related one of said one or more repeater ranch boundaries,
   - generating a repeater placement plan for placement of repeater elements according to constraints of said repeater ranch boundaries and said capture zones, and
   - generating a final routing result to define interconnects between functional blocks that interconnect said repeater elements according to said repeater placement plan.

2. A method as recited in claim 1 wherein said capture zone is defined by a capture zone boundary and wherein said capture zone boundary and said related repeater ranch boundary intersect.

3. A method as recited in claim 1 wherein said repeater ranch is defined by a repeater ranch boundary and said repeater ranch boundary is substantially coincident with an inner boundary of one of said functional blocks.

4. A method as recited in claim 1 wherein said step of generating said repeater placement plan optimizes said repeater placement plan according to minimal interconnect length.

5. A method as recited in claim 1 wherein said step of generating said repeater placement plan optimizes said repeater placement plan according to a target interconnect delay.

6. A method as recited in claim 1 wherein the step of defining one or more repeater ranches further comprises the step of defining one or more repeater ranch boundaries in one or more areas of increased electrical interconnect density as determined from said intermediate routing result.

7. A method as recited in claim 1 wherein said step of generating a repeater placement plan further comprises the steps of placing a first repeater element along an interconnect on an interior of one of said repeater ranches and then placing a second repeater element along said interconnect and relative to said first repeater element.

8. A system for designing an IC comprising:
   - a processing element,
   - means for generating an intermediate routing result on said processing element to define interconnects between functional blocks on an IC,
   - means for defining one or more repeater ranches in an interstice of said IC, said repeater ranches defined by repeater ranch boundaries,
   - means for defining one or more capture zones comprising an area within which one of said repeater elements that is positioned within said capture zone is repositioned within a related one of said one or more repeater ranch boundaries,
   - means for generating a repeater placement plan on said processing element for placement of repeater elements according to constraints of said repeater ranches, and
   - means for generating a final routing result on said processing element to define interconnects between functional blocks that interconnect the elements according to said repeater placement plan.

9. A system as recited in claim 8 wherein said capture zone is defined by a capture zone boundary and wherein said capture zone boundary and said related repeater ranch boundary intersect.

10. A method as recited in claim 8 wherein said repeater ranch is defined by a repeater ranch boundary and said repeater ranch boundary is substantially coincident with an inner boundary of one of said functional blocks.

11. A system as recited in claim 8 wherein said means for generating said intermediate routing result optimizes said intermediate routing result according to minimal interconnect length.

12. A system as recited in claim 8 wherein said means for generating said repeater placement plan optimizes said repeater placement plan according to a target interconnect delay.

13. A system as recited in claim 8 wherein said means for defining one or more repeater ranches further comprises means for defining one or more repeater ranch boundaries in one or more areas of increased electrical interconnect density as determined from said intermediate routing result.

14. A system as recited in claim 8 wherein said means for generating a repeater placement plan further comprises means for placing a first repeater element along an interconnect on an interior of one of said repeater ranches and then placing a second repeater element along said interconnect and relative to said first repeater element.

15. A method of positioning electronic repeater elements in an IC design comprising the steps of:
   - executing a router process to position electrical interconnects between functional blocks for the IC design to generate an intermediate routing result,
   - defining one or more repeater ranches in an interstice of the IC design, each said repeater ranch defined by repeater ranch boundaries, said repeater ranch boundaries defining exclusive placement areas for one or more repeater elements,
   - defining one or more capture zones related to one or more of said repeater ranches, each capture zone comprising an area wherein one or more of said repeater elements that are positioned within said capture zone are repositioned within a related one of said repeater ranches,
   - executing a repeater insertion process according to said one or more repeater ranch boundaries to generate a repeater placement plan which defines positioning of repeater elements in said IC design,
   - discarding said intermediate routing result,
   - executing said router process with benefit of said repeater placement plan to generate a second routing result to interconnect said repeater elements of said repeater placement plan.

16. A method as recited in claim 15 wherein each said capture zone is defined by a capture zone boundary and wherein said boundary of said related repeater ranch intersects with said boundary of said capture zone.

17. A method as recited in claim 15 wherein said repeater ranch boundary is substantially coincident with an inner boundary of one of said functional blocks.

18. A method as recited in claim 15 wherein said router software execution optimizes said intermediate routing result according to minimum interconnect length.

19. A method as recited in claim 15 wherein said repeater insertion software optimizes said repeater placement plan according to a target interconnect delay.

20. A method as recited in claim 15 wherein said repeater insertion software further comprises the steps of placing a first repeater element along an interconnect on an interior of one of said repeater ranch boundaries and then placing a second repeater element along said interconnect and relative to said first repeater element.

21. A system for positioning electronic repeater elements in an IC design comprising:

a processing device having access to memory, a graphical display device in communication with said processing device, means for executing a routing process on said processing device to define positions for electrical interconnects between functional blocks for the IC design to generate an intermediate routing result, means for defining on said graphical display device one or more repeater ranches in an interstice of the IC design, said repeater ranches defined by repeater ranch boundaries and said repeater ranch boundaries defining exclusive placement areas for one or more repeater elements, means for defining on said graphical display device one or more capture zones, each capture zone comprising an area bounded by a capture zone boundary where one or more of said repeater elements positioned within said capture zone is repositioned within one of said repeater ranch boundaries of one of said repeater ranches related to said capture zone, means for executing a repeater insertion process on said processing device to generate a repeater placement plan consistent with constraints of said one or more repeater ranch boundaries to define positions of repeater elements in said IC design, and means for executing said routing process on said processing device with benefit of said repeater placement plan to generate a final routing result to interconnect said repeater elements of said repeater placement plan.

22. A method as recited in claim 21 wherein said one or more capture zone boundaries intersect said related repeater ranch boundary.

23. A method as recited in claim 21 wherein said repeater ranch boundary is substantially coincident with an inner boundary of one of said functional blocks.

24. A method as recited in claim 21 wherein said router process optimizes said intermediate routing result according to minimum interconnect length.

25. A method as recited in claim 21 wherein said repeater insertion process optimizes said repeater placement plan according to a target interconnect delay.

26. A system as recited in claim 21 wherein said means for executing a repeater insertion process further comprises means for placing a first repeater element along an interconnect on an interior of one of said repeater ranch boundaries and then placing a second repeater element along said interconnect and relative to said first repeater element.

* * * * *